United States Patent
Marques

(10) Patent No.: US 7,262,481 B1
(45) Date of Patent: Aug. 28, 2007

(54) FILL STRUCTURES FOR USE WITH A SEMICONDUCTOR INTEGRATED CIRCUIT INDUCTOR

(75) Inventor: Augusto M. Marques, Austin, TX (US)

(73) Assignee: NXP B.V., Eindhoven (NL)

( * ) Notice: Subject to any disclaimer, the term of this patent is extended or adjusted under 35 U.S.C. 154(b) by 221 days.

(21) Appl. No.: 11/014,142

(22) Filed: Dec. 16, 2004

(51) Int. Cl.
*H01L 29/00* (2006.01)
*H01L 27/102* (2006.01)

(52) U.S. Cl. .................. 257/531; 257/533; 257/516
(58) Field of Classification Search .......... 257/531, 257/533, 516
See application file for complete search history.

(56) References Cited

U.S. PATENT DOCUMENTS

| | | | |
|---|---|---|---|
| 6,310,387 B1 | 10/2001 | Seefeldt et al. | |
| 6,429,504 B1 * | 8/2002 | Beaussart et al. | 257/531 |
| 6,784,518 B1 | 8/2004 | Merckel et al. | |
| 2002/0084509 A1 * | 7/2002 | Ballantine et al. | 257/531 |
| 2005/0073025 A1 * | 4/2005 | Hashizume et al. | 257/531 |
| 2005/0190035 A1 | 9/2005 | Wang | |

* cited by examiner

*Primary Examiner*—Jerome Jackson
*Assistant Examiner*—Joseph Nguyen
(74) *Attorney, Agent, or Firm*—Peter Zawilski

(57) ABSTRACT

A semiconductor integrated circuit includes an inductor formed by a conductive loop that is fabricated on one or more metal layers. The inductor also includes a dielectric region provided adjacent to the conductive loop. The semiconductor integrated circuit may also include a pattern of electrically isolated metallic fill structures formed within the dielectric region.

20 Claims, 6 Drawing Sheets

715 ⟶

415 ⟶

FILL STRUCTURES FOR USE WITH A SEMICONDUCTOR INTEGRATED CIRCUIT INDUCTOR

BACKGROUND OF THE INVENTION

1. Field of the Invention

This invention relates to semiconductor integrated circuits and, more particularly, to metal fill structures and metallization layers within semiconductor integrated circuits.

2. Description of the Related Art

Integrated Circuits (ICs) are manufactured using complex processes including a variety of specific processing steps. Typically, the solid-state devices that make up an IC are formed on the surface (or substrate) of a semiconducting material such as silicon, for example. Although silicon has been the most widely used semiconducting material, other materials such as Gallium-Arsenide (GaAs) and Silicon-Germanium (SiGe) have also become popular for certain applications including analog and specialty integrated circuits. Once the devices have been formed, the individual components are interconnected. The devices are typically interconnected by metal lines or wires made from aluminum, copper, tungsten or some other conductive material. The metal lines are typically manufactured by depositing layers of metal over the entire surface of the wafer and then precisely etching away areas other than those defining the metal lines. Due to the high density of devices, most modern ICs include multiple metal layers that may be separated by an interlayer dielectric (ILD).

Analog and mixed signal ICs may rely on high quality passive devices such as capacitors and inductors for proper circuit operation. Mixed signal ICs may include both analog and digital circuits that are manufactured on the same semiconducting substrate. As process technologies have improved, it has become more common to build passive devices such as inductors onto the die as part of the IC. A typical IC inductor may have one or more loops (or coils) of conductive material formed onto one or more layers of the integrated circuit.

In conventional ICs, the die areas adjacent (i.e., inside the loop and in close proximity to the exterior part of the inductor loop) to the inductor loop are typically left void of metal and thus filled with dielectric material. In some cases, these unused areas may present manufacturing issues. For example, it is sometimes desirable in IC designs to maintain consistent metal density and uniformity for manufacturability reasons and to ensure good planarization. Typically the goal is to increase the metal density to above 20% but below about 70% or 80% and in a uniform way. Fill programs are commonly used to add metal dummy fill structures wherever it is considered necessary. However, in some designs such as analog designs the dummy metal fill structures may not be desirable since they may detrimentally affect circuit performance. More particularly, placing some types of metal structures such as the dummy fill structures, within the loop or in close proximity to the exterior part of the inductor loop may adversely affect the electrical characteristics of the inductor.

It would accordingly be desirable to provide an integrated circuit structure that may provide desired metal density while reducing some of the adverse effects associated with conventional fill metal in close proximity to inductors.

SUMMARY

Various embodiments of a fill structure for use with a semiconductor integrated circuit inductor are disclosed. In one embodiment, a semiconductor integrated circuit includes an inductor formed by a conductive loop that is fabricated on one or more metal layers. The inductor also includes a dielectric region provided adjacent to the conductive loop. The semiconductor integrated circuit may also include a pattern of electrically isolated metallic fill structures formed within the dielectric region.

In one specific implementation, the geometry of each fill structure may be a square, while in another specific implementation the geometry of each fill structure may be a cross-shaped pattern.

In some implementations, the pattern may be distributed such that the pattern includes a higher density of fill structures in areas exhibiting a weaker magnetic field and a lower density of fill structures in areas exhibiting a stronger magnetic field.

In another embodiment, semiconductor integrated circuit includes an inductor formed by a conductive loop that is fabricated on one or more metal layers. The inductor also includes a dielectric region provided adjacent to the conductive loop. The semiconductor integrator circuit also includes a pattern of electrically isolated metallic fill structures formed within the dielectric region and within an area defined by a perimeter of the conductive loop.

Figure 1:
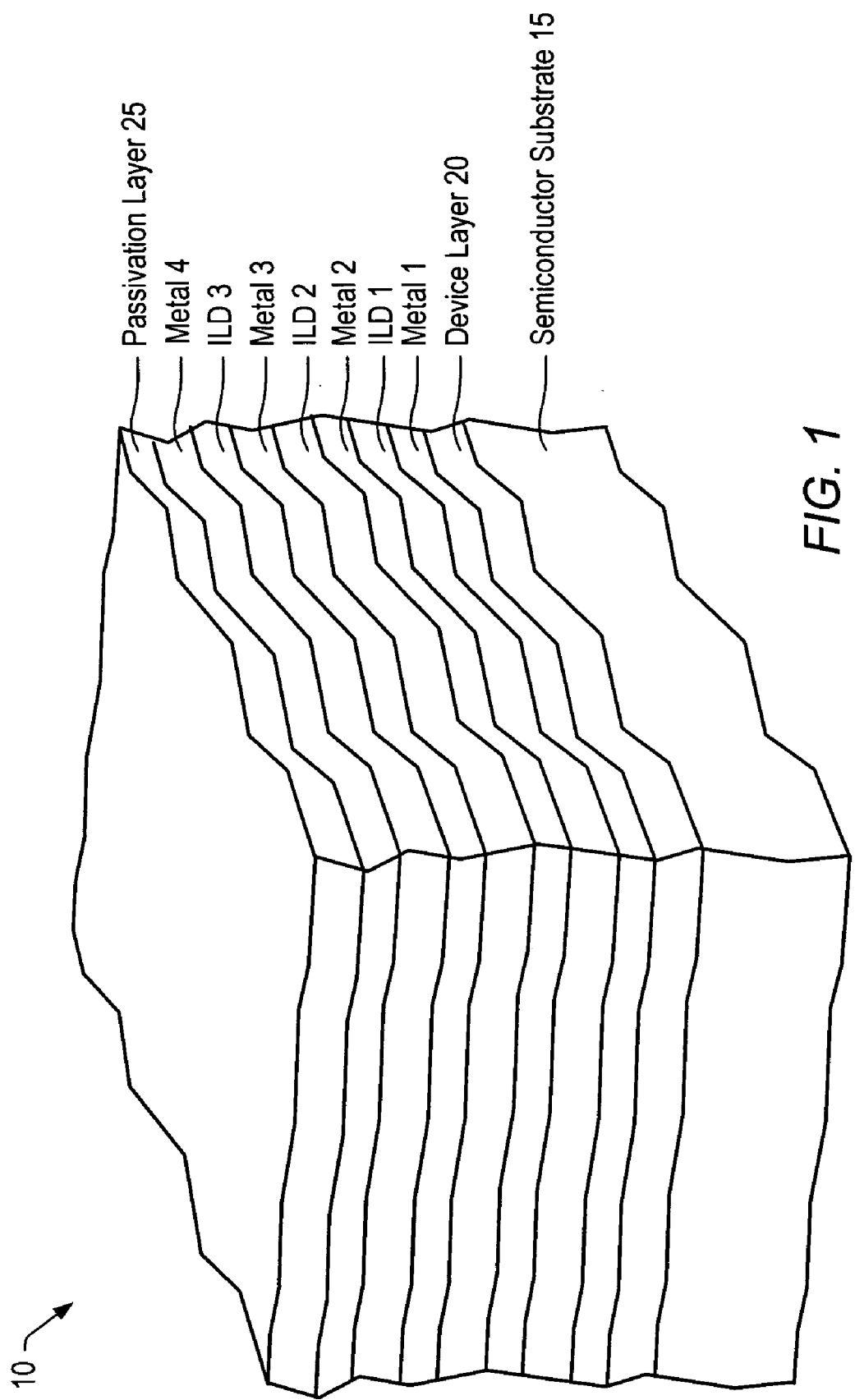
FIG. 1 is a cross sectional perspective view diagram of a portion of an integrated circuit die including various exemplary layers.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include" and derivations thereof mean "including, but not limited to." The term "connected" means "directly or indirectly connected," and the term "coupled" means "directly or indirectly coupled."

DETAILED DESCRIPTION

Turning now to FIG. 1, a cross sectional perspective view diagram of a portion of an integrated circuit die 10 including various exemplary layers is shown. The integrated circuit die 10 includes a semiconductor substrate 15 upon which a device layer 20 including various components and solid-state devices may be manufactured. In addition, integrated circuit die 10 includes four metal layers designated metal 1 through metal 4. The metal layers are separated by interlayer or intermetallic dielectric (ILD) layers, which are designated ILD 1 through ILD 3. Lastly, a passivation layer 25 covers metal layer 4. It is noted that although in the illustrated embodiment four metal layers and three ILD layers are shown, other embodiments may include any number of metal layers and any number of ILD layers. Alternative embodiments are also possible that incorporate other types of layers, such as thin film device layers, for example.

In one embodiment, the semiconductor substrate 15 may be a silicon substrate. However, in various other embodiments, the semiconductor substrate 15 may be embodied using other types of semiconducting materials such as Gallium-Arsenide (GaAs) or Silicon-Germanium (SiGe) for example.

Integrated circuit devices may be formed on both the surface of semiconductor substrate 15 as well as other layers using multiple process steps. As discussed above, the devices may be connected to one another via metal wires formed on the various metal layers. In the illustrated embodiment, the devices may be interconnected by metal lines that may be fabricated on one or more of metal layers 1-4. In addition to the active devices, passive components such as inductors (not shown in FIG. 1) may be formed on the various metal layers. Various exemplary inductors are described below and shown in FIG. 2 through FIG. 6.

In one embodiment, the integrated circuit may be a mixed signal IC that includes both analog and digital circuits. For example, in one embodiment, integrated circuit die 10 may include RF and baseband circuitry that embodies a transceiver for use in a communications device such as a cellular phone. As such, integrated circuit die 10 may include inductors that may be used in circuits such as voltage-controlled oscillators, for example. It is noted that in other embodiments, the integrated circuit may embody other types of circuits.

Figure 2:
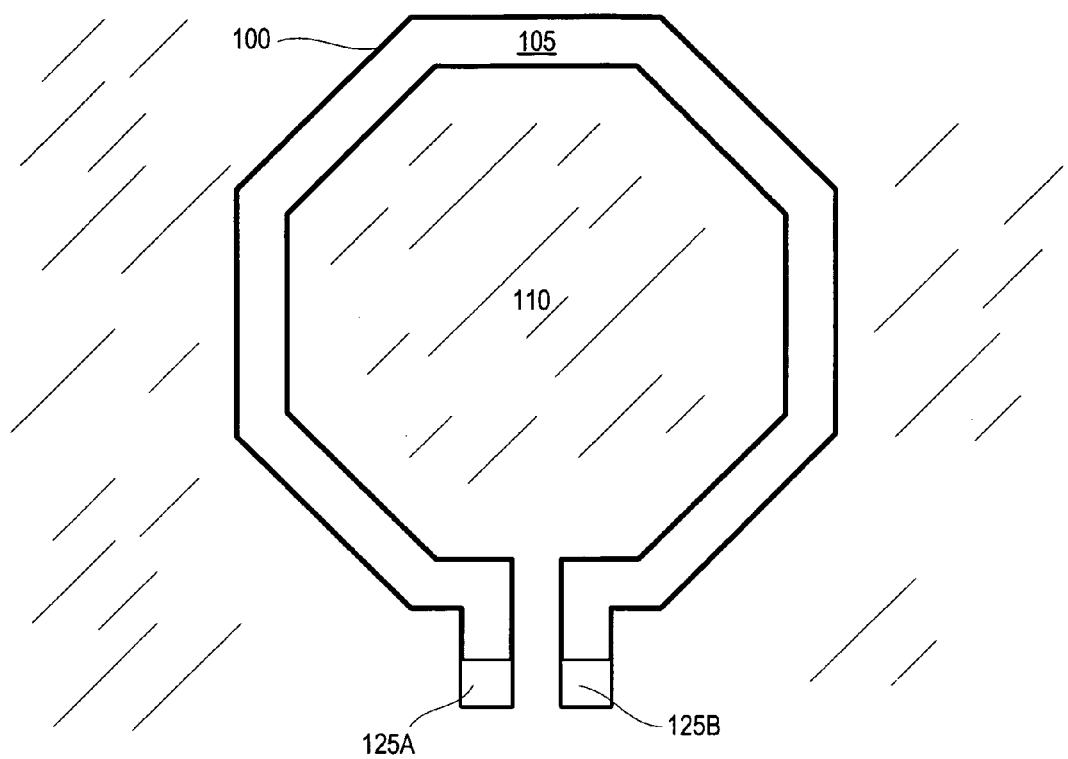
FIG. 2 is a top view diagram of one embodiment of an integrated circuit inductor formed on an integrated circuit die.
Figure 3:
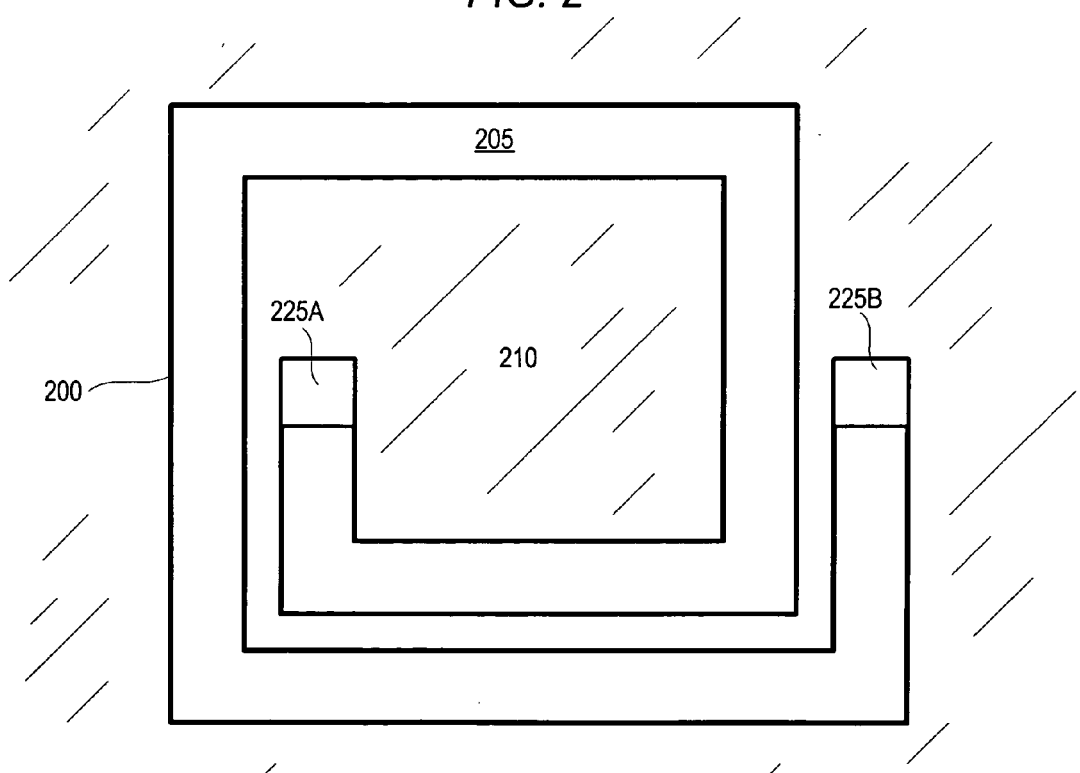
FIG. 3 is a top view diagram of another embodiment of an integrated circuit inductor formed on an integrated circuit die.

FIG. 2 and FIG. 3 illustrate top view diagrams of exemplary embodiments of integrated circuit inductors. In FIG. 2, a top view diagram of one embodiment of an integrated circuit inductor formed on an integrated circuit die such as the integrated circuit die 10 of FIG. 1 is shown. Not unlike a single-turn discrete component inductor, the integrated circuit inductor 100 includes a conductive portion 105 that forms a conductive loop. In the illustrated embodiment, the loop is formed using a hexagonal shape. As would be the case for a typical discrete inductor, the area within the loop is referred to as the core 110 of the inductor. Inductor 100 also includes contact pads 125A and 125B for connecting inductor 100 to other components (not shown).

In one embodiment, inductor 100 may be formed on one or more layers of the IC. For example, conductive portion 105 may be formed on one of the metal layers of the IC, while contact pads 125A and 125B may contact another conductive layer (not shown) of the IC using one or more vias. As described above, in conventional IC inductors the area that surrounds inductor 100 and the area that forms core 110 of inductor 100 may be left void of any conductive material such as metal, for example. As illustrated in FIG. 1, these areas may be formed my dielectric material such as the interlayer dielectric material (e.g., oxide) that may be between layers of the IC. These areas may be referred to as the regions of dielectric material.

It is noted that in various other embodiments, semiconductor integrated circuit inductors may be formed using various shapes and geometries and may include any number of loops or turns. In some embodiments, the multiple loops may be formed on the same layer using a spiraled conductive portion, while in various other embodiments, each of the multiple loops may be formed on a different layer; thereby using several layers to form the conductive loop. The loops may be interconnected using the contact pads and via (not shown). Further, inductor loops may be formed vertically using multiple layers per loop.

In FIG. 3, a top view diagram of one such alternative embodiment of an inductor formed on an integrated circuit die such as the integrated circuit die 10 of FIG. 1 is shown. Similar to inductor 100 of FIG. 2, inductor 200 of FIG. 3 also includes a conductive portion 205 that forms a conductive loop and a core 205. In the illustrated embodiment, the loop is formed into a rectangular shape. Inductor 200 also includes contact pads 225A and 225B for connecting inductor 200 to other components (not shown).

As described above, in some cases the inductors may be adversely affected by metalization in close proximity to the conductive loop. More particularly, when metal structures such as conventional dummy metal fill structures, for example, are placed within the magnetic field of an inductor, eddy currents that cause an opposing magnetic field may be produced on the dummy metal fill structures. Since these opposing fields may reduce the inductor's magnetic field, the inductance of the inductor may be effectively reduced, decreasing the Q of the inductor. Furthermore, the induced eddy currents on the conventional dummy metal fill structures may cause power loss on the fill structure, which implies added loss to the inductor and further degradation of the Q of the inductor. Accordingly, placing conventional dummy metal fill structures in close proximity to the conductive loop is typically disfavored in many IC designs.

Figure 4:
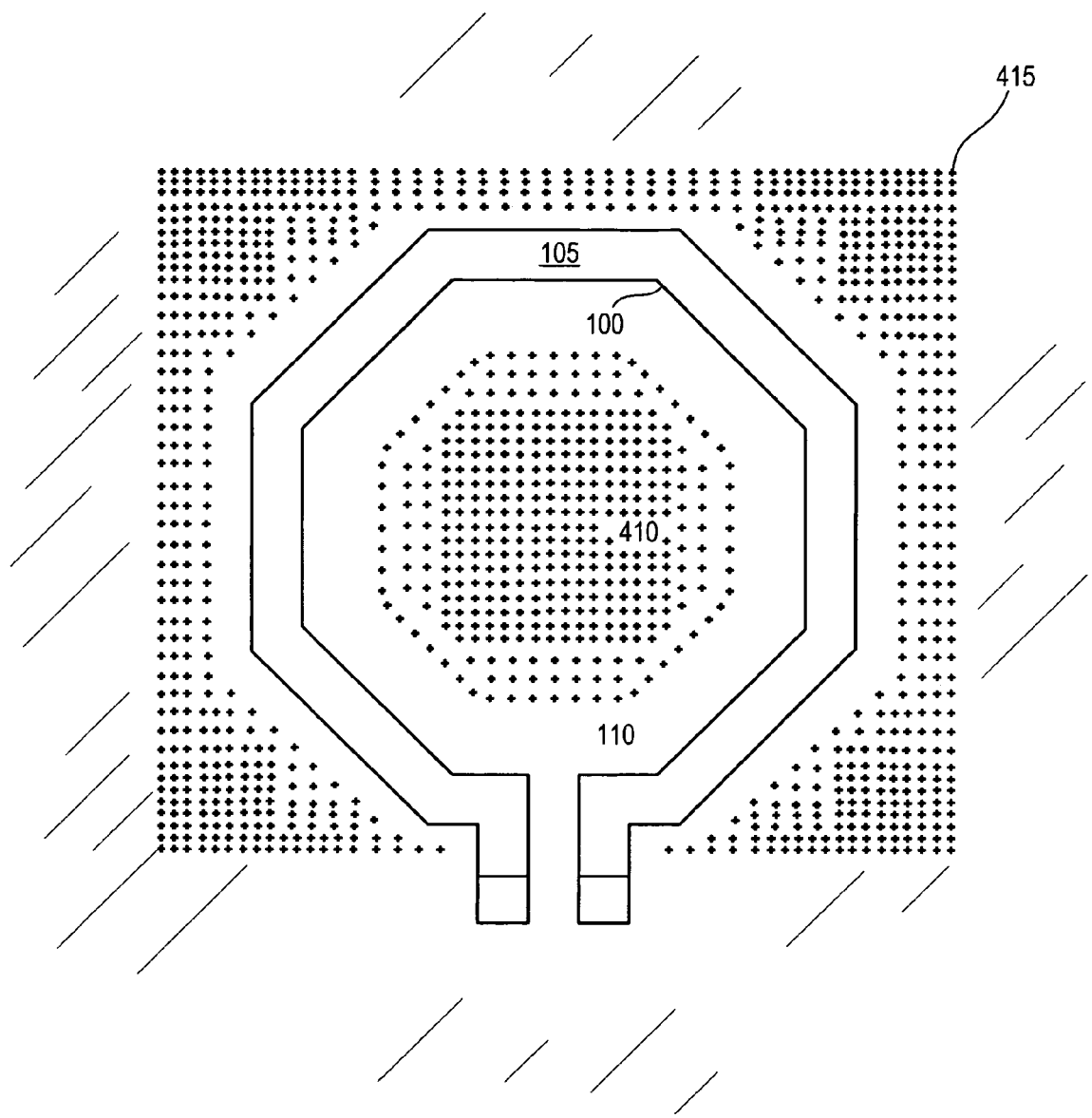
FIG. 4 is a top view diagram of the integrated circuit inductor of FIG. 2 including a pattern of metal fill structures.
Figure 5:
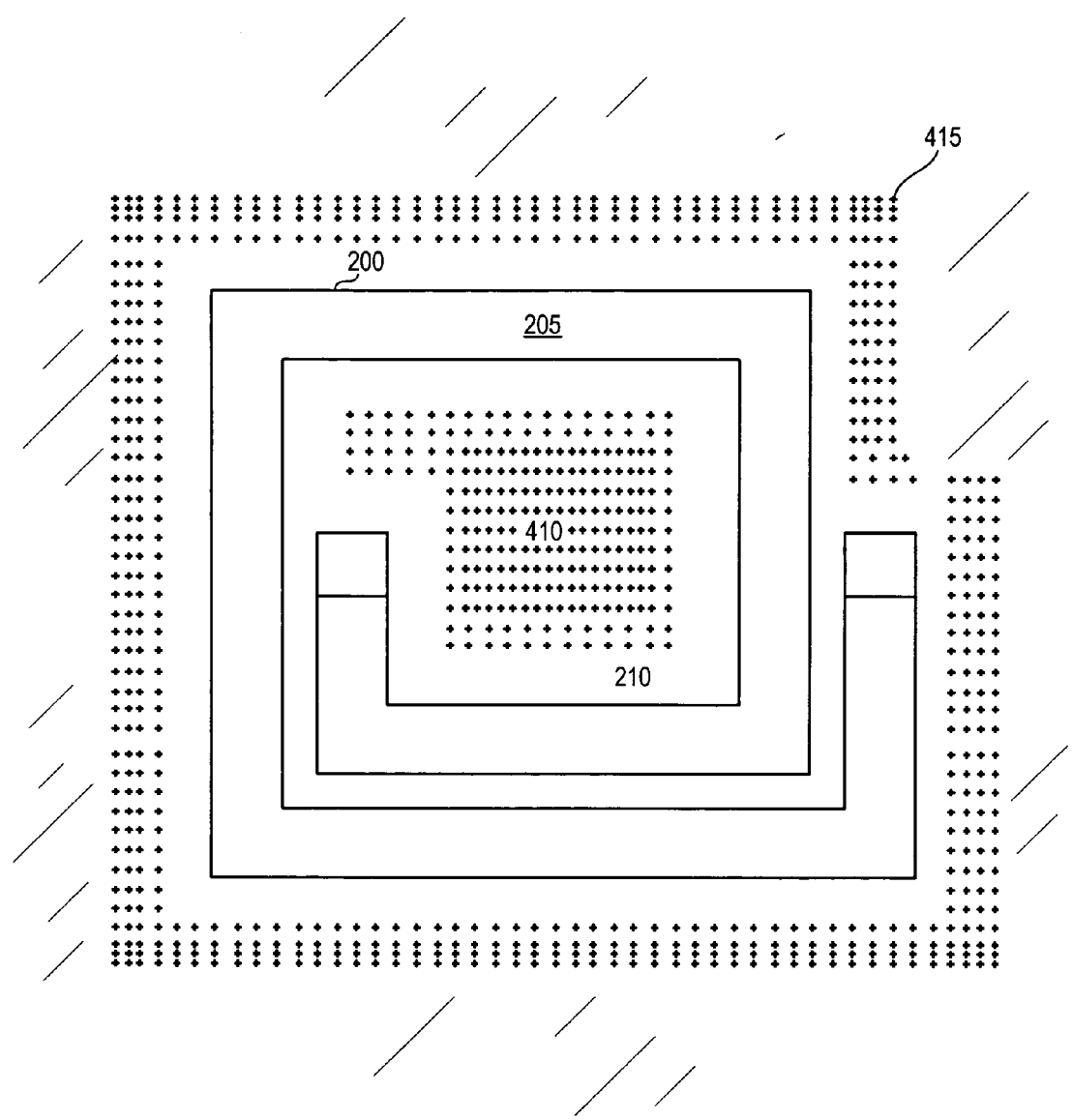
FIG. 5 is a top view diagram of the integrated circuit inductor of FIG. 3 including a pattern of metal fill structures.
Figure 6:
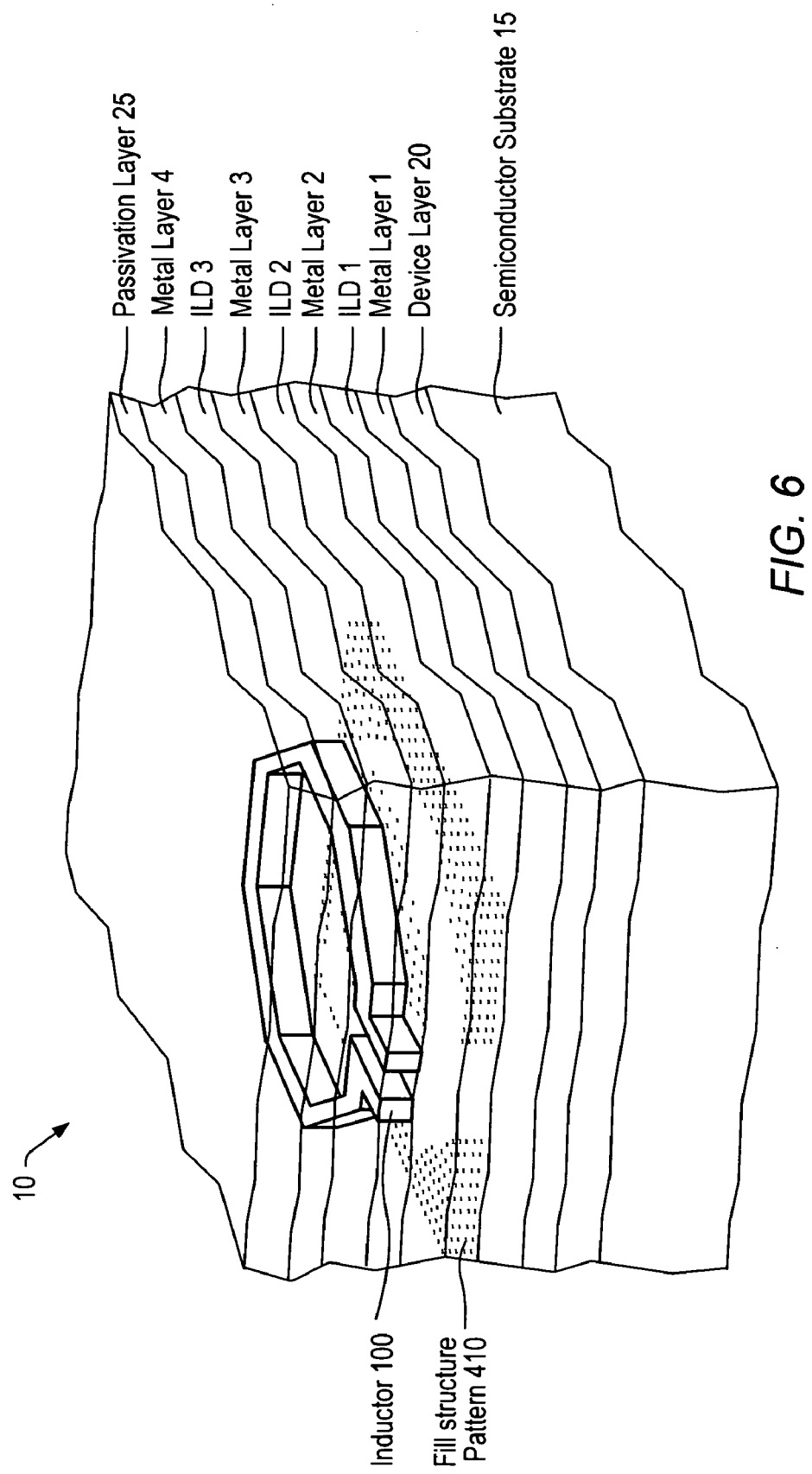
FIG. 6 is a cross sectional perspective view diagram of a portion of an integrated circuit die including an integrated circuit inductor and a pattern of metal fill structures.

Thus, in FIG. 4 and FIG. 5, patterns or fill structures are shown that may provide desirable metal density on a given layer (e.g., metal layer 2) but may cause less degradation of the electrical characteristics of an inductor than the degradation caused by a conventional dummy metal fill. FIG. 4 is a top view diagram showing the integrated circuit inductor 100 of FIG. 2 and a pattern of fill structures 410, while FIG. 5 is a top view diagram of the integrated circuit inductor 200 of FIG. 3 and a pattern of fill structures 410. It is noted that the integrated circuit inductors and patterns of fill structures as illustrated in FIG. 4 and FIG. 5 may be incorporated on any of the metal layers of integrated circuit die 10, as desired.

Referring collectively to FIG. 4 and FIG. 5, fill structure pattern 410 is a pattern of conductive (e.g., metallic) fill structures 415 that are formed within the dielectric region (e.g., in the area that is typically occupied by dielectric material in conventional IC inductors). Specifically, pattern 410 is formed both within an area defined by a perimeter of the loops and external to the loops, which are the regions of the dielectric material. In addition, as described further below, in the illustrated embodiment, there are no fill structures 415 either touching or in very close proximity to the conductive loops 105 and 205. Thus, in some embodiments, there may be a gap in which no fill structures 415 are formed. Further, each of fill structures 415 are electrically isolated from one another and floating with respect to circuit ground.

It is noted that although fill structures 415 are shown as being implemented as cross-shaped structures, in other embodiments fill structures 415 may be implemented in various shapes and geometries. In addition, it is noted that in other embodiments, the pattern 410 may extend further away from conductive loops 105 and 205 than what is shown in FIG. 4 and FIG. 5, respectively. Additionally, as will be described in greater detail below in conjunction with the description of FIG. 6, pattern 410 may be implemented on any of one or more of the metal layers of the IC.

Any inductor losses caused by pattern 410 may depend of a variety of parameters including, for example, the thickness of the metal layer used to form pattern 410, the type of material being used, the geometry of the fill structure, etc. For example, a conductive structure that is very permeable to the magnetic field of the inductor may be desirable. Thus, when modeling the losses, the current density may first be derived as $$J = \sigma E = \sigma \mu_0 H_0 j \omega \frac{r}{2}$$

Now, consider the equation for the power loss for a simple resistor:

$$P = \frac{I^2 R}{2}$$

and applying this to a conductor with a surface area A and resistivity ρ, $$P = \frac{\rho L (JA)^2}{2A} = \frac{J^2 V \rho}{2}$$

This result may be used to find the power loss in a ring having a radius r. Thus, $$\partial P = \frac{\rho J^2 dV}{2} = \frac{\pi}{4} \sigma t (\mu_0 H_0 \omega)^2 r^3 \partial r$$

and the total power dissipated in a ring with a radius r will be $$P = \frac{\pi}{16} \sigma t (\mu_0 H_0 \omega)^2 r^4.$$

Accordingly, since the power dissipated is proportional to the fourth power of the radius of the structure, the conductive structure should be as small as possible. However, to increase the metal density to desirable levels, a number N of small structures having an area $A_S$ may be used to fill the space of the inductor $A_I$. Thus, a fill density F may be expressed as $$F = \frac{A_S}{A_I} N.$$

Figure 7A:
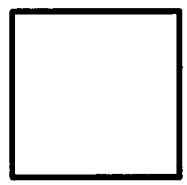
FIG. 7A is a top view diagram illustrating further details of one embodiment of a metal fill structure of FIG. 4 and FIG. 5.
Figure 7B:
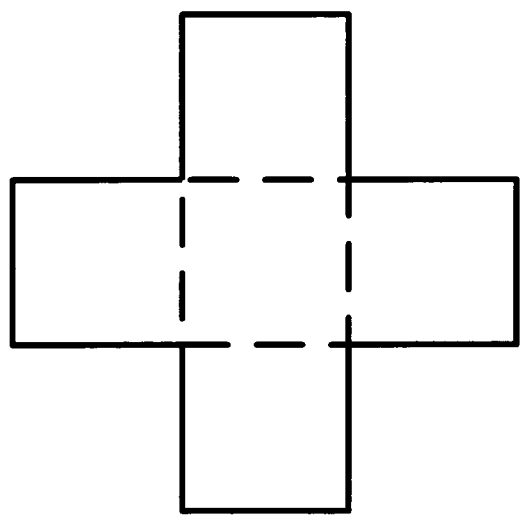
FIG. 7B is a top view diagram illustrating further details of an alternative embodiment of a metal fill structure of FIG. 4 and FIG. 5.

Furthermore, since the formation of eddy current loops may intensify the opposing magnetic fields, fill structures 415 of the pattern 410 are left isolated with respect to each other to reduce the area in which to form current loops. Two exemplary fill structures are shown in FIG. 7A and FIG. 7B.

In addition, as shown in FIG. 4, the pattern 410 may be distributed with a varying fill density. Since the losses in the inductor may be attributed to an effective series resistance, $R_E$, and $$R_E = \frac{1}{8\pi} \sigma t (\omega L)^2 \left(\frac{A_S}{A_I}\right)^2, \quad \text{and} \quad \frac{F}{N} = \frac{A_S}{A_I},$$

then $R_E$ is proportional to $$H_O^2 \left(\frac{F}{N}\right)^2.$$

Accordingly, in one embodiment, in areas where the intensity of the magnetic field ($H_O$) is very high (e.g., close to conductive loop 105), the fill density F of the pattern of conductive structures may be minimal or even non-existent. In contrast, the density of the conductive structures may be increased in areas where the intensity of the magnetic field is weaker. It is noted that dependent upon the magnetic field profile of the specific inductor implementation, the pattern density may be increased as a function of the distance from the conductive loop 105. Thus, in the illustrated embodiments, the pattern density is greater both near the middle of the core 110 and farther away from the conductive loop 105.

It is noted that the actual patterns of conductive structures shown in FIG. 4 and FIG. 5 are only exemplary patterns and that other patterns are possible and contemplated. In alternative embodiments, the conductive structures may be distributed uniformly wherever the pattern is formed. It is further noted that in other embodiments, pattern 410 may be formed only within an area defined by a perimeter of the loop (i.e., inside the loop) or only outside the loop.

In addition, in various embodiments, patterns of fill structures 410 need not necessarily be formed on the same metal layer as the metal layer(as) on which the conductive loop forming the inductor is formed. For example, referring to FIG. 6, a cross-sectional perspective view diagram of a portion of integrated circuit die 10 of FIG. 1 including the integrated circuit inductor 100 and a pattern of metal fill structures 410 is shown. In this particular embodiment, inductor 100 is formed on metal layer 3, while patterns of fill structures 410 are formed on metal layer 2. However, it is noted that inductor 100 and pattern 410 may be formed on any metal layer (including the same layer). In addition, depending on the specific implementation, more than one metal layer may include similar patterns of fill structures 410. For example, since inductor 100 is formed on metal layer 3 in the illustrated embodiment, any or all of the metal layers, including metal layer 3, may include similar patterns of fill structures 410.

FIG. 7A and FIG. 7B illustrate exemplary geometries of suitable fill structures. The fill structure 715 of FIG. 7A is a substantially square structure. As described above, to minimize the radius, the dimensions of fill structure 715 may be kept as small as possible according to the design rules in use for the particular manufacturing facility.

The fill structure 415 of FIG. 7B is a cross-shaped structure having substantially equally sized appendages similar to a "plus" sign, for example. In some implementations, fill structure 415 may be formed by placing five substantially square structures (e.g., fill structure 715 of FIG. 7A) in the depicted cross-shaped configuration. It is noted that in other embodiments a variety of alternative geometries (e.g., rectangular, hexagonal, etc.) may be used to form each fill structure.

In some specific implementations, the geometry of fill structure 415 shown in FIG. 7B may be preferably to the geometry of fill structure 715 shown in FIG. 7A. More particularly, many design rules specify a minimum area for a given structure. That minimum area may produce a square that is larger than the minimum line widths that a specific technology is capable of producing. Accordingly, fill structure 715 may have a minimum area that is larger than the minimum effective area of fill structure 415. For example, if the minimum line widths are 0.2 microns (um), the technology may be capable of producing a 0.2 um×0.2 um square yielding an area of 0.04 um$^2$. However, this same technology may only allow a minimum area of 0.144 um$^2$ for a given structure. Thus, to facilitate the minimum area, fill structure 715 may have minimum side dimensions of 0.38 um$^2$. In contrast, conductive structure 415 may be implemented using the minimum line width dimensions of 0.2 um. Thus, the area of fill structure 415 may b 0.2×0.2×5 or 0.2 um$^2$, which has a considerably smaller effective radius than that of fill structure 715.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A semiconductor integrated circuit comprising:
   an inductor formed by a conductive loop fabricated on one or more metal layers and a dielectric region provided adjacent to the conductive loop; and
   a pattern of electrically isolated metallic fill structures formed within the dielectric region,
   wherein each of the fill structures is electrically floating with respect to circuit ground.

2. The semiconductor integrated circuit as recited in claim 1, wherein the geometry of each fill structure is substantially square.

3. The semiconductor integrated circuit as recited in claim 1, wherein the geometry of each fill structure is a cross-shaped pattern.

4. The semiconductor integrated circuit as recited in claim 1, wherein the pattern is distributed such that the pattern includes a higher density of fill structures in areas exhibiting a weaker magnetic field and a lower density of fill structures in areas exhibiting a stronger magnetic field.

5. The semiconductor integrated circuit as recited in claim 1, wherein the pattern of fill structures is substantially uniformly distributed.

6. The semiconductor integrated circuit as recited in claim 1, wherein the permeability of the pattern of electrically isolated metallic fill structures to a magnetic field of the inductor is sufficient to attain proper operation of the inductor.

7. The semiconductor integrated circuit as recited in claim 1, wherein the dielectric region is formed on any of the one or more metal layers.

8. A semiconductor integrated circuit comprising:
   an inductor formed by a conductive loop fabricated on one or more metal layers and a dielectric region provided adjacent to the conductive loop; and
   a pattern of electrically isolated metallic fill structures formed in the dielectric region and within an area defined by a perimeter of the conductive loop; and
   a pattern of additional fill structures formed external to perimeter of the loop.

9. The semiconductor integrated circuit as recited in claim 8, wherein each of the fill structures is electrically floating with respect to circuit ground.

10. The semiconductor integrated circuit as recited in claim 8, wherein the geometry of each fill structure is substantially square.

11. The semiconductor integrated circuit as recited in claim 8, wherein the geometry of each fill structure is a cross-shaped pattern.

12. The semiconductor integrated circuit as recited in claim 8, wherein the pattern is distributed such that the pattern includes a higher density of fill structures in areas exhibiting a weaker magnetic field and a lower density of fill structures in areas exhibiting a stronger magnetic field.

13. The semiconductor integrated circuit as recited in claim 8, wherein the pattern of fill structures is substantially uniformly distributed.

14. The semiconductor integrated circuit as recited in claim 8, wherein the permeability of the pattern of electrically isolated metallic fill structures to the magnetic field of the inductor is sufficient to attain proper operation of the inductor.

15. A method comprising:
    forming an inductor by fabricating a conductive loop on one or more metal layers of a semiconductor integrated circuit and providing a dielectric region adjacent to the conductive loop;
    forming a pattern of electrically isolated metallic fill structures within the dielectric region; and
    wherein each of the fill structures is electrically floating with respect to circuit ground.

16. The method as recited in claim 15, further comprising forming each fill structure such that the geometry is substantially square.

17. The method as recited in claim 15, further comprising forming each fill structure such that the geometry is a cross-shaped pattern.

18. The method as recited in claim 15, further comprising distributing the fill structures such that the pattern includes a higher density of fill structures in areas exhibiting a weaker magnetic field and a lower density of fill structures in areas exhibiting a stronger magnetic field.

19. The method as recited in claim 15, further comprising distributing the fill structures substantially uniformly.

20. The method as recited in claim 15, forming the dielectric region on any of the one or more metal layers.

* * * * *

UNITED STATES PATENT AND TRADEMARK OFFICE
CERTIFICATE OF CORRECTION

PATENT NO.           : 7,262,481 B1                              Page 1 of 1
APPLICATION NO.      : 11/014142
DATED                : August 28, 2007
INVENTOR(S)          : Marques It is certified that error appears in the above-identified patent and that said Letters Patent is hereby corrected as shown below:

In The Specification

In Column 2, Line 21, delete "semiconductor" and insert -- a semiconductor --, therefor.

In Column 2, Line 25, delete "integrator" and insert -- integrated --, therefor.

In Column 4, Line 7, delete "my" and insert -- by --, therefor.

In Column 4, Line 47, delete "or" and insert -- of --, therefor.

In Column 6, Line 55, delete "layer(as)" and insert -- layer(s) --, therefor.

In Column 7, Line 20, delete "preferably" and insert -- preferable --, therefor.

In Column 7, Line 36, delete "may b" and insert -- may be --, therefor.

Signed and Sealed this
Twenty-sixth Day of April, 2016

Michelle K. Lee
*Director of the United States Patent and Trademark Office*